United States Patent
Yi et al.

(10) Patent No.: US 9,295,162 B2
(45) Date of Patent: Mar. 22, 2016

(54) NON-DELETERIOUS TECHNIQUE FOR CREATING CONTINUOUS CONDUCTIVE CIRCUITS UPON THE SURFACES OF A NON-CONDUCTIVE SUBSTRATE

(71) Applicant: Taiwan Green Point Enterprises Co., Ltd., Hsinchu (TW)

(72) Inventors: Sheng-Hung Yi, Taichung (TW); Pen-Yi Liao, Taichung (TW)

(73) Assignee: Taiwan Green Point Enterprises Co., Ltd., Taichung (TW)

( * ) Notice: Subject to any disclaimer, the term of this patent is extended or adjusted under 35 U.S.C. 154(b) by 106 days.

(21) Appl. No.: 14/149,457

(22) Filed: Jan. 7, 2014

(65) Prior Publication Data

US 2014/0116885 A1     May 1, 2014

Related U.S. Application Data

(63) Continuation of application No. 13/035,531, filed on Feb. 25, 2011, now Pat. No. 8,621,749.

(60) Provisional application No. 61/313,367, filed on Mar. 12, 2010.

(51) Int. Cl.
*H05K 3/02* (2006.01)
*H05K 3/10* (2006.01)
(Continued)

(52) U.S. Cl.
CPC ...... *H05K 3/188* (2013.01); *C25D 5/02* (2013.01); *C25D 5/10* (2013.01); *H05K 3/027* (2013.01);
(Continued)

(58) Field of Classification Search
CPC ............ C25D 5/02; C25D 5/10; H05K 3/185; H05K 3/188; H05K 3/027; H05K 3/24; H05K 2203/107; Y10T 29/49156; Y10T 29/49155; Y10T 29/49126
USPC ............ 29/830, 846, 847, 852; 174/257, 261; 205/125; 430/311, 315, 945
See application file for complete search history.

(56) References Cited

U.S. PATENT DOCUMENTS 3,754,939 A    8/1973 Pearlstein et al.
3,781,596 A    12/1973 Galli et al.
(Continued)

FOREIGN PATENT DOCUMENTS

JP    05-065687    3/1993
JP    H10209607 A    8/1998
(Continued)

OTHER PUBLICATIONS

Notice of Allowance on U.S. Appl. No. 14/134,046, mailed Feb. 6, 2015.
(Continued)

*Primary Examiner* — Donghai D Nguyen
(74) *Attorney, Agent, or Firm* — Volpe and Koenig, P.C.

(57) ABSTRACT

A non-deleterious method for producing a continuous conductive circuit upon a non-conductive substrate can begin with the application of a metallic base layer upon a surface of a non-conductive substrate. A circuit pattern can be created within the metallic base layer based upon a circuit design. The metallic base layer comprising the circuit pattern can be physically separated from the remainder of the metallic base layer on the non-conductive substrate. The region of the non-conductive substrate surface that encloses the circuit pattern can be called the plating region. The remainder of the non-conductive substrate surface can be called the non-plating region. A first metal layer can be added upon the metallic base layer. A second metal layer can be added upon the first metal layer of the plating region. The second metal layer can be electrically conductive and restricted from forming on the first metal layer of the non-plating region.

9 Claims, 4 Drawing Sheets

(51) Int. Cl.
*H05K 3/18* (2006.01)
*C25D 5/02* (2006.01)
*C25D 5/10* (2006.01)
*H05K 3/24* (2006.01)

(52) U.S. Cl.
CPC *H05K 3/185* (2013.01); *H05K 3/24* (2013.01); *H05K 2203/107* (2013.01); *Y10T 29/49126* (2015.01); *Y10T 29/49155* (2015.01); *Y10T 29/49156* (2015.01)

(56) References Cited

U.S. PATENT DOCUMENTS

| | | | |
|---|---|---|---|
| 3,853,589 | A | 12/1974 | Andrews |
| 4,001,470 | A | 1/1977 | Schulze-Berge |
| 4,066,804 | A | 1/1978 | Andrews |
| 4,264,646 | A | 4/1981 | Thornburg et al. |
| 4,574,095 | A | 3/1986 | Baum et al. |
| 4,790,912 | A | 12/1988 | Holtzman et al. |
| 4,865,873 | A | 9/1989 | Cole, Jr. et al. |
| 4,877,644 | A | 10/1989 | Wu et al. |
| 4,882,200 | A | 11/1989 | Liu et al. |
| 4,898,648 | A | 2/1990 | Cusano |
| 4,925,522 | A | 5/1990 | Avellino et al. |
| 4,946,563 | A | 8/1990 | Yeatts |
| 4,963,701 | A | 10/1990 | Yasumoto et al. |
| 4,988,412 | A | 1/1991 | Liu et al. |
| 5,084,299 | A | 1/1992 | Hirsch et al. |
| 5,086,966 | A | 2/1992 | Melton et al. |
| 5,340,773 | A | 8/1994 | Yamamoto |
| 5,494,781 | A * | 2/1996 | Ohtani ............ H05K 3/027 430/311 |
| 5,525,204 | A * | 6/1996 | Shurboff ........... H01L 21/4853 29/843 |
| 5,924,364 | A | 7/1999 | Grabley et al. |
| 6,162,365 | A | 12/2000 | Bhatt et al. |
| 6,188,391 | B1 | 2/2001 | Seely et al. |
| 6,242,156 | B1 | 6/2001 | Teng |
| 6,261,671 | B1 | 7/2001 | Asai et al. |
| 6,291,093 | B1 | 9/2001 | Kindler et al. |
| 6,325,910 | B1 | 12/2001 | Meyer et al. |
| 6,359,233 | B1 | 3/2002 | Joy et al. |
| 6,515,233 | B1 | 2/2003 | Labzentis et al. |
| 6,563,057 | B2 | 5/2003 | Hotta et al. |
| 6,696,173 | B1 | 2/2004 | Naundorf et al. |
| 6,773,760 | B1 | 8/2004 | Sung et al. |
| 6,801,438 | B1 | 10/2004 | Castro |
| 6,908,534 | B2 | 6/2005 | Hongo et al. |
| 7,060,421 | B2 | 6/2006 | Naundorf et al. |
| 7,257,891 | B2 | 8/2007 | Lee et al. |
| 7,276,267 | B2 | 10/2007 | Schauz |
| 7,279,407 | B2 | 10/2007 | Akram et al. |
| 7,291,380 | B2 | 11/2007 | Nyholm et al. |
| 7,365,006 | B1 | 4/2008 | Huemoeller et al. |
| 7,608,305 | B2 | 10/2009 | Chan et al. |
| 7,656,393 | B2 | 2/2010 | King et al. |
| 7,674,647 | B2 | 3/2010 | Arai |
| 7,719,522 | B2 | 5/2010 | Lyon et al. |
| 7,754,601 | B2 | 7/2010 | Chen et al. |
| 7,779,522 | B2 | 8/2010 | Chen et al. |
| 7,935,559 | B1 | 5/2011 | Giffard et al. |
| 8,621,749 | B2 | 1/2014 | Yi et al. |
| 8,692,790 | B2 | 4/2014 | Yi et al. |
| 8,952,919 | B2 | 2/2015 | Yi et al. |
| 2002/0119251 | A1 | 8/2002 | Chen et al. |
| 2003/0165633 | A1 | 9/2003 | Ryu et al. |
| 2003/0214486 | A1 | 11/2003 | Roberts |
| 2004/0149986 | A1 | 8/2004 | Dubowski et al. |
| 2005/0112432 | A1 | 5/2005 | Erlebacher et al. |
| 2006/0030128 | A1 | 2/2006 | Bu et al. |
| 2006/0115982 | A1 | 6/2006 | Morisue et al. |
| 2007/0004200 | A1 | 1/2007 | Akram et al. |
| 2007/0059449 | A1 | 3/2007 | Ryu et al. |
| 2007/0097154 | A1 | 5/2007 | Kojima |
| 2007/0148420 | A1 | 6/2007 | Salama et al. |
| 2007/0247822 | A1 | 10/2007 | Naundorf |
| 2007/0261232 | A1 | 11/2007 | Landsberger et al. |
| 2008/0001297 | A1 | 1/2008 | Lotz et al. |
| 2009/0188708 | A1 | 7/2009 | En et al. |
| 2009/0277672 | A1 | 11/2009 | Matsumoto |
| 2009/0288593 | A1 | 11/2009 | Rulkens et al. |
| 2009/0298256 | A1 | 12/2009 | Chen et al. |
| 2010/0026656 | A1 | 2/2010 | Hotelling et al. |
| 2010/0136735 | A1 | 6/2010 | Arai |
| 2010/0258173 | A1 | 10/2010 | Laia et al. |
| 2010/0259173 | A1 | 10/2010 | Zhang |
| 2011/0215477 | A1 | 9/2011 | Chen et al. |
| 2011/0278050 | A1 | 11/2011 | Yi et al. |
| 2012/0273261 | A1 | 11/2012 | Yi et al. |
| 2012/0278050 | A1 | 11/2012 | Hsiao et al. |
| 2014/0102775 | A1 | 4/2014 | Yi et al. |
| 2014/0116885 | A1 | 5/2014 | Yi et al. |
| 2014/0183020 | A1 | 7/2014 | Yi et al. |

FOREIGN PATENT DOCUMENTS

| | | |
|---|---|---|
| JP | 11-097824 | 4/1999 |
| JP | 2003-029425 | 1/2003 |
| TW | 1250223 | 4/1988 |
| TW | 200952117 | 9/1997 |
| WO | WO-2005/054120 | 6/2005 |
| WO | 2009142497 A1 | 11/2009 |

OTHER PUBLICATIONS

Dai, Wen, et al., Selective metallization of cured SU-8 microstructures using electroless plating method, MEMS-2006, Sep. 2006, 2 pages.

Grojo, D. et al., "Experimental investigation of ablation mechanisms involved in dry laser cleaning," Applied Surface Science, vol. 253, Issue 19, Jul. 31, 2007, pp. 8309-8315.

International Preliminary Report on Patentability for PCT/US12/26182, mailed Feb. 19, 2013.

International Search Report for PCT/US12/26182, mailed Jun. 5, 2012, with the Statement in Response to International Search Report filed by Applicant.

Lu, Y.F. et al, "Laser induced removal of spherical particles from silicon wafers," Journal of Applied Physics, vol. 87, Oct. 1999, pp. 1534-1539.

Niino, Hiroyuki et al., "Positively charged surface potential of polymer films after excimer laser ablation: Application to selective-area electroless plating on the ablated films," Applied Physics Letters, vol. 60, 1992, one page.

Notice of Allowance on U.S. Appl. No. 13/035,531, mailed Oct. 1, 2013.

Wang, Z.B. et al., "Angle Effect in Laser Nanopatterning with Particle-Mask," Journal of Applied Physics, vol. 96, Issue 11, Dec. 2004, pp. 6845-6850.

Wu, X et al., "The Modeling of Excimer Laser Particle Removal from Hydrophilic Silicon Surfaces," Journal of Applied Physics, vol. 87 (3618), Jan. 2000, pp. 3618-3627.

Zheng Y.W. et al., "Dry laser cleaning of particles from solid substrates: Experiments and theory," Journal of Applied Physics, vol. 90, Sep. 2001, pages.

* cited by examiner

NON-DELETERIOUS TECHNIQUE FOR CREATING CONTINUOUS CONDUCTIVE CIRCUITS UPON THE SURFACES OF A NON-CONDUCTIVE SUBSTRATE

CROSS REFERENCE TO RELATED APPLICATIONS

This application is a continuation of U.S. application Ser. No. 13/035,531, filed Feb. 25, 2011, now U.S. Pat. No. 8,621, 749, which claims the benefit of Provisional Application Ser. No. 61/313,367 entitled "A Method of Forming Electrically Conductive Circuits on a Non-conductive Substrate", filed Mar. 12, 2010, which is herein incorporated by reference in its entirety.

BACKGROUND

The present invention relates to the field of electronic circuit fabrication and, more particularly, to a non-deleterious technique for creating continuous conductive circuits upon the surfaces of a non-conductive substrate.

Circuit design and fabrication is an arduous process involving many precise steps. While these steps create precise, high-quality circuitry, the design/fabrication process has become fixed and unyielding to change. Changes to the circuit design propagate into an exponential number of changes to elements of the fabrication process.

For example, in integrated circuit (IC) chip fabrication, a change to the circuit design often requires changing the masks of multiple layers and/or parameters for performing a specific step.

This inflexibility that has become inherent in conventional circuit fabrication processes stifles a company's ability to implement design changes in a timely and cost-effective manner. Further, conventional fabrication processes rely upon working within the non-conductive substrate used to contain the circuitry. The circuit elements are embedded or formed within the non-conductive substrate.

BRIEF SUMMARY

One aspect of the present invention can include a non-deleterious method for producing a continuous conductive circuit upon a non-conductive substrate and a product produced by said method. This aspect can begin with the application of a metallic base layer upon a surface of a non-conductive substrate. The metallic base layer can be compromised of palladium, rhodium, platinum, iridium, osmium, gold, nickel, and/or iron. A circuit pattern can be created within the metallic base layer based upon a circuit design. The metallic base layer comprising the circuit pattern can be physically separated from the remainder of the metallic base layer on the non-conductive substrate. The region of the non-conductive substrate surface that encloses the circuit pattern can be called the plating region. The remainder of the non-conductive substrate surface can be called the non-plating region. A first metal layer can then be added upon the metallic base layer. A second metal layer can be added upon the first metal layer of the plating region. The second metal layer can be electrically conductive and restricted from being added upon the first metal layer of the non-plating region.

Another aspect of the present invention can include a method for producing a continuous conductive circuit upon a non-conductive substrate and a product produced by said method. In this aspect, a non-conductive substrate can be submerged in an active metal solution for a predefined amount of time. The active metal solution can contain metallic particles. When the predetermined amount of time has elapsed, the non-conductive substrate can be removed from the active metal solution. The removed non-conductive substrate can comprise a metallic base layer formed from the metallic particles. A circuit pattern can be formed by removing a portion of the metallic base layer from the non-conductive surface. The resulting substrate with the circuit pattern can be referable to as an intermediary. The metallic base layer can comprise at least two distinct continuous regions separated from each other so that the two distinct continuous regions are electrically isolated from each other. The intermediary can be placed in a chemical plating solution that results in a first metal layer being formed on top of the metallic base layer. The intermediary can be electroplated by attaching electrodes to only the first metal layer of one of the at least two distinct continuous regions to form a second metal layer on top of the first metal layer for that continuous region. At least one of the at least two distinct continuous regions can lack the second metal layer after the electroplating.

Another aspect of the present invention can include a conductive circuit comprising a non-conductive substrate, a metallic base layer, a first metal layer, and a second metal layer. The non-conductive substrate can be formed from at least one of the following materials: a high-molecular polymer, glass, a ceramic, wood, and a fabric. The metallic base layer can be formed upon a portion of the non-conductive substrate. The metallic base layer can form a circuit pattern on the conductive circuit. The metallic base layer can be comprised of at least one of palladium, rhodium, platinum, iridium, osmium, gold, nickel, and iron. A portion of the non-conductive substrate lacking the metallic base layer can comprise a plurality of laser patterns produced when creating the circuit pattern was created within the metallic base layer using a laser. The first metal layer can exist and can be bonded on top of the metallic base layer. The portion of the non-conductive substrate that lacks the metallic base layer will also lack the first metal layer. The first metal layer can have structural characteristics indicative of the first metal layer being added using a chemical plating process. The second metal layer can exist and can be bonded on top of the metallic base layer. The portion of the non-conductive substrate that lacks the metallic base layer will also lack the second metal layer metal layer. The second metal layer can have structural characteristics indicative of the second metal layer being added using an electroplating process.

DETAILED DESCRIPTION

The present invention discloses a non-deleterious process that creates continuous conductive circuits upon the surface of a non-conductive substrate. A metallic base layer can be applied to one or more surfaces of the non-conductive substrate. A circuit pattern can be formed in the metallic base layer by removing the metallic base layer around the elements of the circuit pattern. A first metal layer can then be added to the metallic base layer. A second metal layer of an electrically conductive metal can be added upon the first metal layer of the circuit pattern.

Figure 1:
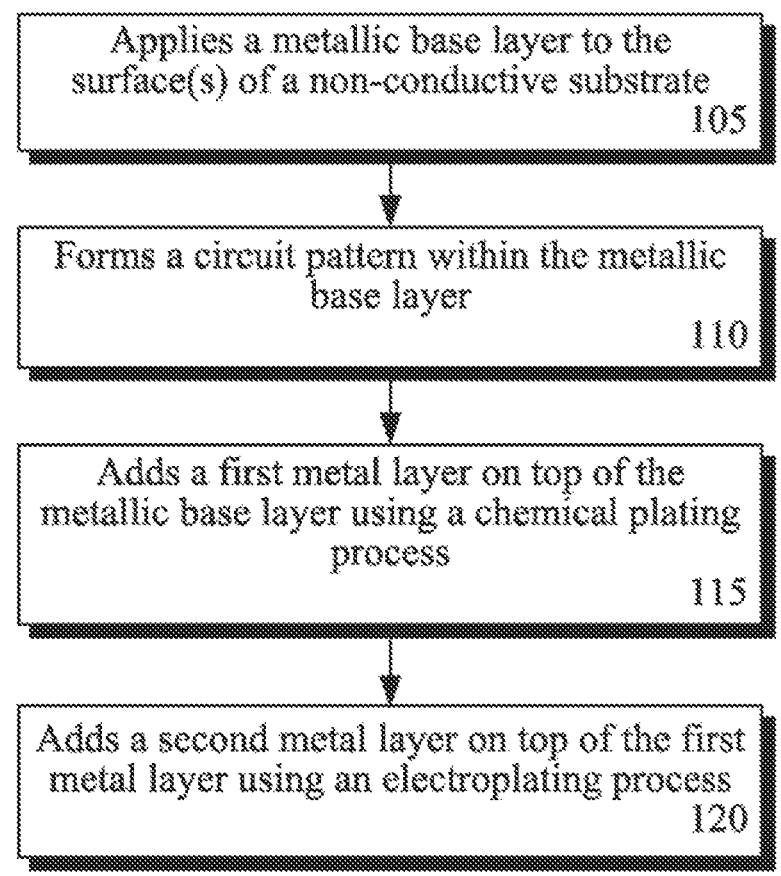
FIG. 1 is a flow chart of a method providing a high-level overview of a non-deleterious process for creating continuous conductive circuits upon the surface of a non-conductive substrate in accordance with embodiments of the inventive arrangements disclosed herein.

FIG. 1 is a flow chart of a method 100 providing a high-level overview of a non-deleterious process for creating continuous conductive circuits upon the surface of a non-conductive substrate in accordance with embodiments of the inventive arrangements disclosed herein.

As used herein, the term "non-conductive substrate" can be used to refer to a variety of materials that do not conduct any or conduct only a negligible amount of electricity. Examples of non-conductive substrates that can be used in the process described herein can include, but are not limited to, high-molecular polymers, glass, ceramics, wood, fabric, stainless steel, and the like.

As used herein, the term "non-deleterious" can be used to indicate that the described process does not cause damage to or impair the integrity of the non-conductive substrate. That is, a continuous conductive circuit created using the described process can exist upon the surface of the non-conductive substrate without compromising the properties and/or original shape of the non-conductive substrate.

Method 100 can begin in step 105 where a metallic base layer can be applied to the surface or surfaces of the non-conductive substrate. Metals used to create the metallic base layer can include, but are not limited to, palladium, rhodium, platinum, iridium, osmium, gold, nickel, iron, and combinations thereof.

A circuit pattern can then be formed within the metallic base layer in step 110. In step 115, a first metal layer can be added on top of the metallic base layer using a chemical plating process. A second metal layer can be added on top of the first metal layer using an electroplating process in step 120, creating a continuous conductive circuit upon the surface or surfaces of the non-conductive substrate.

Upon completion of step 120, the non-conductive substrate and/or continuous conductive circuit can be further utilized in an electronics fabrication process (i.e., electronic components can be connected to the created continuous conductive circuit and/or the non-conductive substrate can be installed within a device).

Figure 2:
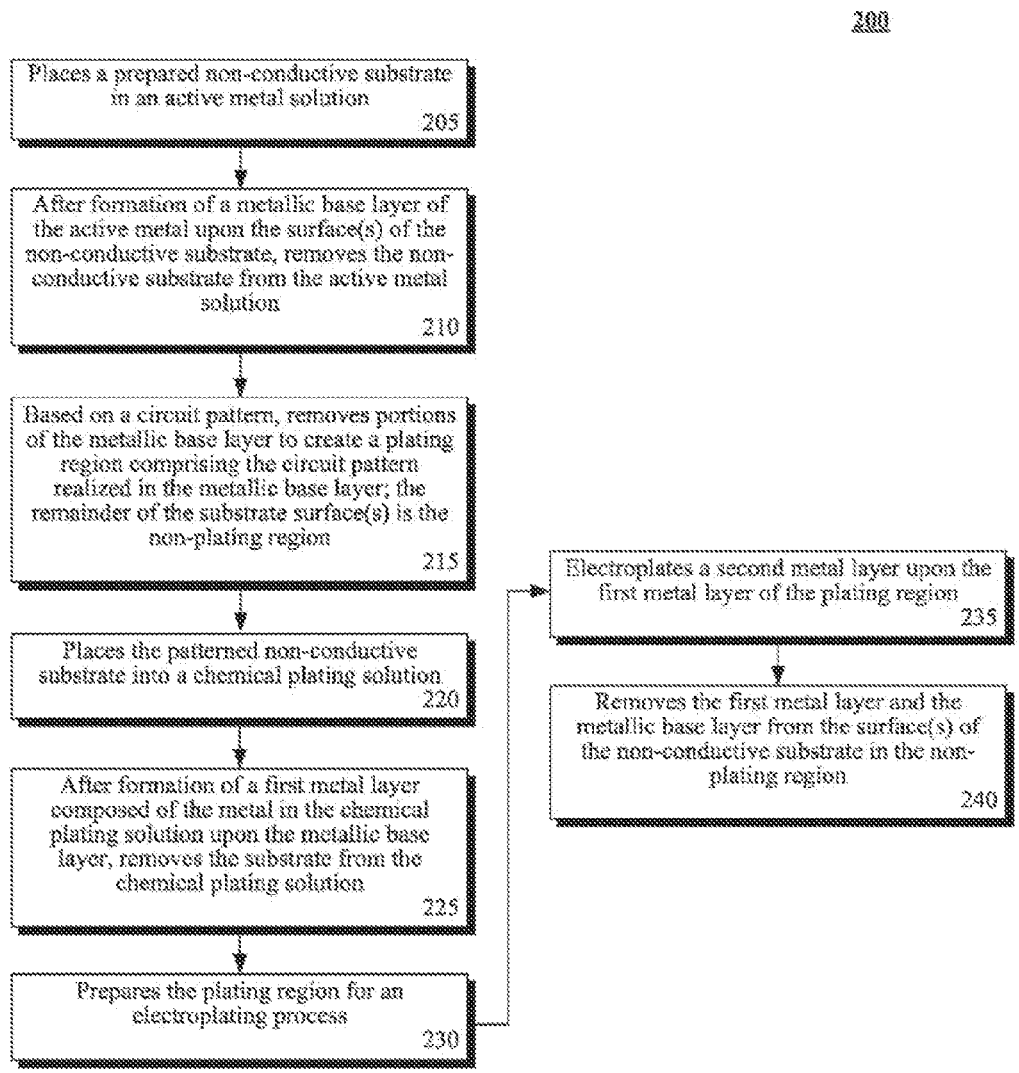
FIG. 2 is a flow chart of a method describing the non-deleterious process for creating continuous conductive circuits upon the surface of a non-conductive substrate in a finer detail in accordance with an embodiment of the inventive arrangements disclosed herein.

FIG. 2 is a flow chart of a method 200 describing the non-deleterious process for creating continuous conductive circuits upon the surface of a non-conductive substrate in a finer detail in accordance with embodiments of the inventive arrangements disclosed herein. Method 200 can represent a more specific embodiment of method 100.

Method 200 can begin in step 205 where a prepared non-conductive substrate can be placed in an active metal solution. Preparation of the non-conductive substrate can include actions such as cleaning, degreasing, etching, and so on, as required for the specific implementation of the non-deleterious process and/or type of non-conductive substrate being used. After formation of a metallic base layer of the active metal upon the surface or surfaces of the non-conductive substrate, the non-conductive substrate can be removed from the active metal solution in step 210.

Performance of step 210 can be based upon quantitative parameters like time in the solution and/or thickness of the active metal layer. These parameters can vary based upon the type of non-conductive substrate, application of continuous conductive circuit, and/or the specifics of the metallization process (e.g., molarity, specific active metal used).

In step 215, portions of the metallic base layer can be removed to realize a circuit pattern in the metallic base layer. The removal of the metallic base layer to realize the circuit pattern can separate circuit elements from the metallic base layer on the remainder of the non-conductive substrate. The region of the surface or surfaces of the non-conductive substrate in which the circuit pattern has been realized can be referred to as the plating region; the remainder of the non-conductive substrate surface or surfaces can be referred to as the non-plating region.

In one contemplated embodiment, preparation of the non-conductive substrate of step 205 can include applying a substance on a portion of the non-conductive substrate that prevents or inhibits to a degree a bonding of the metallic base layer when the non-conductive substrate is placed in the active metal solution. This bonding inhibitor can make removal of portions of the metallic base layer to create the plating region (of step 215) easier than would be otherwise possible.

The patterned non-conductive substrate can then be placed into a chemical plating solution in step 220. In step 225, the non-conductive substrate can be removed from the chemical plating solution after the formation of a first metal layer, composed of the metal contained in the chemical plating solution, upon the metallic base layer. Areas of the non-conductive substrate exposed by the removal of the metallic base layer in step 215 can be unaffected by the chemical plating solution.

The plating region can then be prepared (e.g., rinsed, dried, electrodes attached, etc.) for an electroplating process in step 230. In step 235, a second metal layer can be electroplated upon the first metal layer of the plating region.

It should be emphasized that the electroplating process is only performed upon the plating region and the plating region is conductively separated from the non-plating region; hence, the second metal layer cannot form upon the first metal layer of the non-plating region.

In step 240, the first metal layer and the metallic base layer can be removed from the surface or surfaces of the non-conductive substrate in the non-plating region. Thus, leaving a pattern for a continuous conductive circuit comprised of a metallic base layer, a first metal layer, and a second metal layer upon the surface or surfaces of the non-conductive substrate without affecting the non-conductive substrate.

Figure 3:
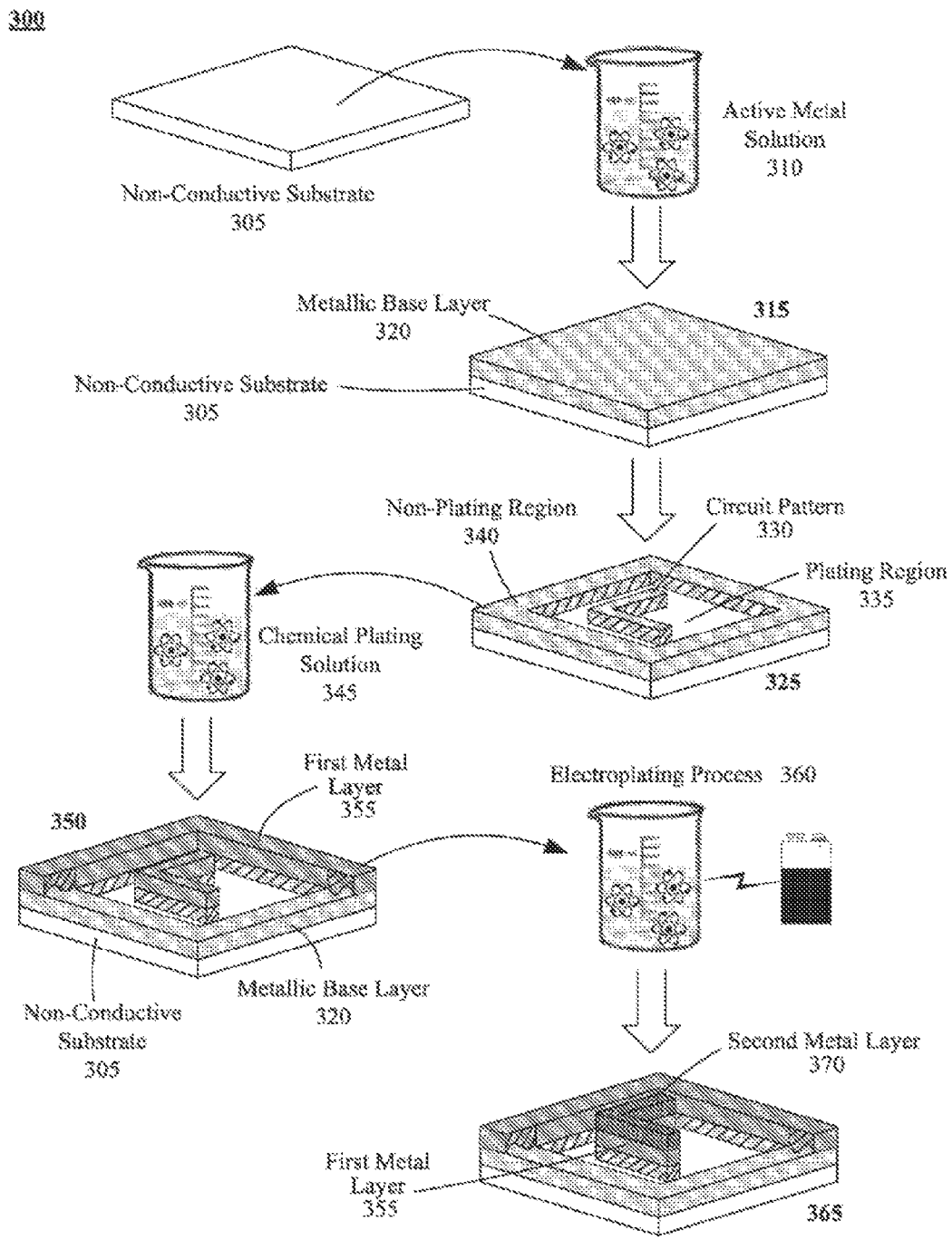
FIG. 3 is an illustrated process flow 300 depicting the non-deleterious creation of a continuous conductive circuit 360 upon a non-conductive substrate in accordance with embodiments of the inventive arrangements disclosed herein.

FIG. 3 is an illustrated process flow 300 depicting the non-deleterious creation of a continuous conductive circuit 380 upon a non-conductive substrate 305 in accordance with embodiments of the inventive arrangements disclosed herein. Process flow 300 can represent a specific embodiment of methods 100 and/or 200.

Process flow 300 can begin with a non-conductive substrate 305 that the surface or surfaces upon which the conductive circuit 380 is to be formed have already been prepared for metallization. It should be emphasized that the surface or surfaces of the non-conductive substrate 305 need not be limited to a planar silhouette. That is, the described process can create a conductive circuit 380 upon a non-conductive substrate 305 where the receiving surface includes concavity and/or convexity.

For example, this process can create conductive circuits 380 upon an external (convex) or internal (concave) surface of a spherical or cylindrical object. Alternately, the surface can have minor convexities and/or concavities like waves or ripples.

As such, the described process can broaden the type of non-conductive substrate 305 topographies, in addition to shapes, that can be used as the basis for conductive circuits 380. The described process can allow the use of non-conductive substrates 305 whose surface imperfections can be considered unacceptable for conventional techniques and/or reduce the need for steps to improve surface flatness like chemical-mechanical planarization (CMP). That is, using the process described herein, no surface flatness improvements following by a photochemical machining (PCM) technique are necessary.

In the example illustrated in process flow 300, the non-conductive substrate 305 can be a piece of polycarbonate. The non-conductive substrate 305 can be placed in an active metal solution 310, such as a palladium solution having a molarity of 10-70 ppm.

Submersion in and the subsequent removal of the non-conductive substrate 305 from the active metal solution 310 can result in intermediary 315. As shown in this example, intermediary 315 can have a metallic base layer 320, indicated in light grey, upon the surface of the non-conductive substrate 305, formed from the active metal supplied by the active metal solution 310.

The specific thickness of the active metal layer 320 can vary based upon the type of active metal, the type of non-conductive substrate 305, the type of conductive circuit 380 being formed, as well as other process-specific variables.

It should be noted that the metallic base layer 320 can be formed on the entirety of the surface area presented by the non-conductive substrate 305, and that the layering shown in process flow 300 can represent a cut-away view so as to emphasize layer distinctions. That is, if all surfaces of the plate-shaped non-conductive substrate 305 are exposed when placed in the active metal solution 310, then the resultant intermediary 315 would have a metallic base layer 320 covering the entirety of the non-conductive substrate 305, and not just the "top" layer, as shown in this example.

A circuit pattern 330 can be realized in the metallic base layer 320, resulting in intermediary 325. Realization of the circuit pattern 330 can involve the removal of the metallic base layer 320 from the non-conductive substrate 305 around areas comprising the circuit pattern 330.

For example, an yttrium aluminum garnet (YAG) laser can be used to remove the metallic base layer 320. In such a process, the YAG laser can provide a power of 4-10 W at a frequency of 5-30 kHz with a power density of 1-7%.

Further, the process to realize the circuit pattern 330 in the metallic base layer 320 can physically separate the metallic base layer 320 into two separate regions. The plating region 335 can include the circuit pattern 330 and any other auxiliary areas to be electroplated later in the process. The remainder of the metallic base layer 320 not included in the plating region 335 can be referred to as the non-plating region 340.

In an alternate embodiment of process flow 300, the metallic base layer 320 of the non-plating region 340 can be removed as well, leaving only the plating region 335 upon the surface of the non-conductive substrate 305.

Intermediary 325 can then be placed in a chemical plating solution 345 to create intermediary 350. As shown by intermediary 350, the chemical plating solution 345 can form a first metal layer 355, indicated by the medium grey layer, upon the metallic base layer 320, the light grey layer.

For example, an electroless copper plating process can result in a first metal layer 355 of copper or an electroless nickel plating process can produce a nickel layer 355.

It is important to note that the first metal layer 355 can be formed on the metallic base layer 320 in both the plating region 335 and the non-plating region 340. While the first metal layer 355, in essence, is only needed on the metallic base layer 320 of the circuit pattern 330, creation of the first metal layer 355 in both regions 335 and 340 can be more cost-effective and time-saving than processing the non-conductive substrate 305 to inhibit the formation of the first metal layer 355 in the non-plating region 340. That is, coating the entirety of the metallic base layer 320 with the first metal layer 355 and later removing the first metal layer 355 from the non-plating region 340 can be easier and more efficient than attempting to limit formation of the first metal layer 355 to the plating region 335.

An electroplating process 360 can be used on the plating region 335 of intermediary 350 to produce intermediary 365. The electrodes used in the electroplating process 360 can be connected such that contact is made with only the plating region 335. Therefore, the second metal layer 375, indicated by the dark grey layer, can only form upon the first metal layer 355 contained within the plating region 335.

Further, since the first metal layer 355 of the plating region 335 and the first metal layer 355 of the non-plating region 340 are physically separated, the non-conductive nature of the substrate 305 can provide additional insulation and limit the electroplating process 360 to only the plating region 335.

Figure 3A:
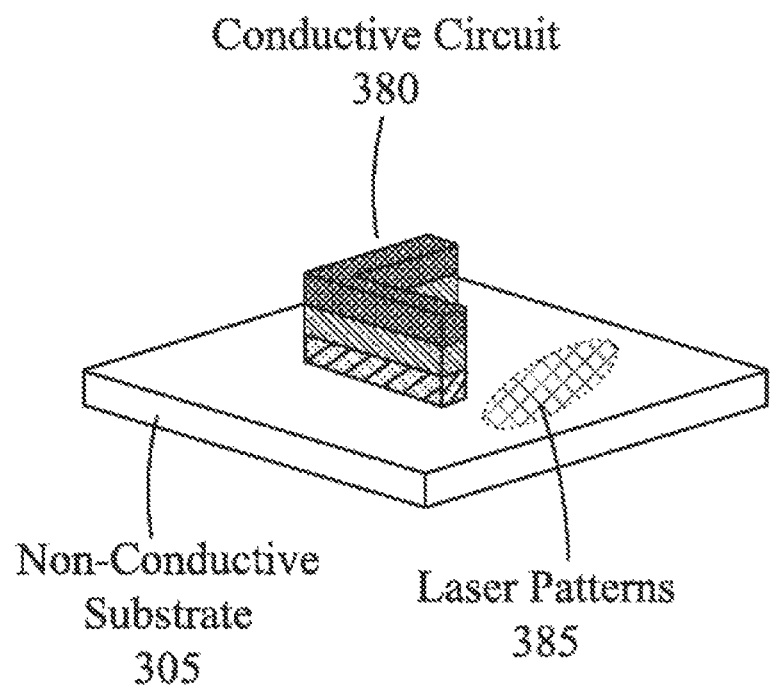
FIG. 3A illustrates the end state of the creation of a continuous conductive circuit upon the surface of a non-conductive substrate using the described non-deleterious process.

Intermediary 365 can then be used as an input medium for other electronic circuit processes. Alternately, the first metal layer 355 and metallic base layer 320 can be removed from intermediary 365 to produce the end state 375 shown in FIG. 3A.

End state 375 can include the conductive circuit 380 formed to the surface of the non-conductive substrate 305. The conductive circuit 380 can include the metallic base layer 320 that binds the first and second metal layers 355 and 370 to the non-conductive substrate 305.

It is important to note that the non-conductive substrate 305 has not been altered by the formation of the conductive circuit 380 shown in end state 375. Process flow 300 can create the conductive circuit 380 without breaking the surface of the non-conductive substrate 305, unlike other conventional formation techniques that embed one or more layers of the conductive circuit 380 within the non-conductive substrate 305. This can keep the integrity of the non-conductive substrate 305 intact.

Further, since this non-deleterious process does not need to take into account modifications of the non-conductive substrate 305 to accommodate the design or circuit pattern 330, the time required to implement a new circuit pattern 330 or a modification to an existing circuit pattern 330 can be significantly decreased.

For example, the typical fabrication process for an integrated circuit (IC) (i.e., micro-processor or chip) can involve specialized substrates (i.e., doped silicon wafers) and multiple lithographic, etching, and/or deposition steps to form the conductive circuit 380. Implementing a single design change to this type of process can result in reworking and/or changing the each mask that comprises the circuit pattern 330, not to mention reconfiguring the machinery to work with the new/changed masks.

Because of this large amount of overhead, design changes can take a larger amount of time to realize in terms of actual fabrication. Thus, many IC manufacturers tend to roll design changes or considerations into a new product line in lieu of attempting to change the design while in fabrication.

With the described process, however, a design can be implemented in a more timely fashion with less difficulty. Since the circuit pattern 330 is applied to the surface of the non-conductive substrate 305 as a single structure, a change to the design can be realized within this process by simply adjusting the process to the new circuit pattern 330.

For example, the realization of the circuit pattern 330 within the metallic base layer 320 can be altered to utilize the new circuit pattern 330 (i.e., the laser operator would follow the new circuit pattern 330). The new circuit pattern 330 may also require a change in the placement of the electrodes during the electroplating process 360. These process changes can be considered relatively minor when compared to those encountered in conventional conductive circuit 380 formation processes.

The invention claimed is:

1. A method comprising:
    applying a metallic base layer on at least one surface of a non-conductive substrate;
    creating a circuit pattern on a first portion of the metallic base layer, wherein the first portion of the metallic base layer is physically separated from a second portion of the metallic base layer;
    adding a first metal layer on the metallic base layer;
    attaching an apparatus configured to facilitate an electroplating process to a first portion of the non-conductive substrate that lies beneath the first portion of the metallic base layer; and
    performing the electroplating process to form a second metal layer on a first portion of the first metal layer that covers the first portion of the metallic base layer, wherein the second metal layer is electrically conductive, and wherein the second metal layer is prevented from being added on a second portion of the first metal layer that covers the second portion of the metallic base layer.

2. The method of claim 1, wherein said metallic base layer comprises at least one of palladium, rhodium, platinum, iridium, osmium, gold, nickel, or iron.

3. The method of claim 1, further comprising preparing the at least one surface of the non-conductive substrate for application of the metallic base layer, wherein the preparation of the at least one surface of the non-conductive substrate comprises at least one of cleaning, degreasing, etching, rinsing, drying, or polishing.

4. The method of claim 1, wherein application of the metallic base layer utilizes one of chemical vapor deposition (CVD), electrochemical deposition, atomic layer deposition, plating, or chemical solution deposition (CSD).

5. The method of claim 1, wherein, when application of the metallic base layer utilizes a liquid-based application process, the method further comprising:
    submerging the non-conductive substrate in an active metal solution for a predefined amount of time; and
    when the predefined amount of time has elapsed, removing the non-conductive substrate from the active metal solution.

6. The method of claim 1, wherein creating the circuit pattern further comprises:
    positioning the circuit pattern at a desired location on the first portion of the non-conductive substrate; and
    removing the metallic base layer from the at least one surface of the non-conductive substrate around each element of the circuit pattern.

7. The method of claim 6, wherein removal of the metallic base layer utilizes a yttrium aluminum garnet (YAG) laser.

8. The method of claim 1, wherein the addition of the first metal layer further comprises:
    placing the non-conductive substrate in a chemical plating solution for a predetermined amount of time, wherein the chemical plating solution contains metallic particles to form the first metal layer; and
    when the predetermined amount of time has elapsed, removing the non-conductive substrate from the chemical plating solution, wherein the first metal layer has formed on the metallic base layer.

9. The method of claim 1, further comprising, after the addition of the second metal layer, removing the second portion of the first metal layer and the second portion of the metallic base layer from the non-conductive substrate.

* * * * *